United States Patent [19]
Ando et al.

[11] Patent Number: 4,918,451
[45] Date of Patent: Apr. 17, 1990

[54] A/D CONVERTER WITH PREVENTION OF COMPARATOR OUTPUT DISCONTINUITIES

[75] Inventors: Hideki Ando; Takahiro Miki, both of Hyogo, Japan

[73] Assignee: Mitsubishi Denki Kabushiki Kaisha, Tokyo, Japan

[21] Appl. No.: 265,223

[22] Filed: Nov. 1, 1988

[30] Foreign Application Priority Data

Nov. 20, 1987 [JP] Japan .................... 62-294558

[51] Int. Cl.$^4$ .............................................. H03M 1/00
[52] U.S. Cl. .................................... 341/159; 341/155
[58] Field of Search ................................. 341/159, 155

[56] References Cited

U.S. PATENT DOCUMENTS

| | | | |
|---|---|---|---|
| 4,276,543 | 6/1981 | Miller et al. | 341/159 |
| 4,644,322 | 2/1987 | Fujita | 341/159 |
| 4,752,766 | 6/1988 | Shimizu et al. | 341/159 |
| 4,768,016 | 8/1988 | Chu et al. | 341/159 |

OTHER PUBLICATIONS

"Transfer System of Data Driving Type Processor Q-p", (National Conference on the 32nd Jyohosyori-gakkai; Society of Information Processing (First Term, 1986).

A. Dingwall, "Monolithic Expandable 6 bit 20 MHz CMOS/SOS A/D Converter", IEEE Journal of Solid-State Circuits, vol. SC-14, No. 6 (Dec. 1979).

*Primary Examiner*—William M. Shoop, Jr.
*Assistant Examiner*—Helen Kim
*Attorney, Agent, or Firm*—Lowe, Price, Leblanc, Becker & Shur

[57] ABSTRACT

A reference voltage is divided by a plurality of resistors (6), the respective voltages and an analogue input voltage being compared with each other by comparators (7). An output of each of the comparators is applied to a data transfer circuit (13) of a hand shake type and latched. The data transfer circuit shifts discontinuous portions of logic which appeared in latched data. Therefore, simultaneous selection of a plurality of addresses in an encoder (10) is avoided.

4 Claims, 7 Drawing Sheets

FIG. 2  PRIOR ART

| ADDRESS | b7 | b6 | b5 | b4 | b3 | b2 | b1 | b0 |
|---|---|---|---|---|---|---|---|---|
| 0 | 0 | 0 | 0 | 0 | 0 | 0 | 0 | 0 |
| 1 | 0 | 0 | 0 | 0 | 0 | 0 | 0 | 1 |
| 2 | 0 | 0 | 0 | 0 | 0 | 0 | 1 | 1 |
| 3 | 0 | 0 | 0 | 0 | 0 | 0 | 1 | 0 |
| ⋮ | | | | | | | | |
| 126 | 1 | 1 | 1 | 1 | 1 | 1 | 1 | 0 |
| 127 | 1 | 1 | 1 | 1 | 1 | 1 | 1 | 1 |

FIG. 3  PRIOR ART

| k | C(k) | F(k) |
|---|---|---|
| 0 | 1 | 0 |
| 1 | 1 | 0 |
| ⋮ | ⋮ | ⋮ |
| 60 | 1 | 1 |
| 61 | 0 | 0 |
| 62 | 0 | 0 |
| 63 | 1 | 0 |
| 64 | 1 | 1 |
| 65 | 0 | 0 |
| ⋮ | ⋮ | ⋮ |
| 126 | 0 | 0 |
| 127 | 0 | 0 |

FIG. 7

| CORRECT VALUE | ACTUAL OUTPUT |
|---|---|
| 60 | 60 |
| 61 | 60 |
| 62 | 60 |
| 63 | 60 or 64 |
| 64 | 60 or 64 |
| 65 | 65 |

FIG. 8

| CORRECT VALUE | ACTUAL OUTPUT |
|---|---|
| 60 | 60 |
| 61 | 60 or 61 or 62 or 64 |
| 62 | 64 |
| 63 | 64 |
| 64 | 64 |
| 65 | 65 |

FIG. 9

| CORRECT VALUE | ACTUAL OUTPUT |
|---|---|
| 60 | 60 |
| 61 | 60 or 61 or 62 |
| 62 | 62 |
| 63 | 62 |
| 64 | 64 |
| 65 | 65 |

FIG. 10

| k | C(k) | G(k) | F(k) |
|---|---|---|---|
| 0 | 1 | 1 | 0 |
| 1 | 1 | 1 | 0 |
| ⋮ | ⋮ | ⋮ | ⋮ |
| 60 | 1 | 1 | 0 |
| 61 | 0 | 1 | 0 |
| 62 | 0 | 1 | 1 |
| 63 | 1 | 0 | 0 |
| 64 | 1 | 0 | 0 |
| 65 | 0 | 0 | 0 |
| ⋮ | ⋮ | ⋮ | ⋮ |
| 126 | 0 | 0 | 0 |
| 127 | 0 | 0 | 0 |

A/D CONVERTER WITH PREVENTION OF COMPARATOR OUTPUT DISCONTINUITIES

BACKGROUND OF THE INVENTION

1. Field of the Invention

The present invention relates generally to an A/D converter and more particularly, to an improvement of an A/D converter of a flash type.

2. Description of the Prior Art

A so-called A/D converter of a flash type has been used in the field of picture processing or the like because it can process at high speed. FIG. 1 is a circuit diagram showing an example of a conventional A/D converter of a flash type, which is described in, for example, an article by Andrew G. F. Dingwall, entitled "Monolithic Expandable 6 Bit 20 MHz CMOS/SOS A/D Converter", IEEE JOURNAL OF SOLID-STATE CIRCUITS, VOL. SC-14, No. 6, DECEMBER, 1979, pp. 926–932. Referring to FIG. 1, reference voltages $VR^+$ and $VR^-$ are applied to reference voltage terminals 3 and 4, respectively. A voltage between the reference voltages $VR^+$ and $VR^-$ is divided by connecting 128 resistors 6 in series between the reference voltage terminals 3 and 4. Assuming that the reference numbers of 0 to 127 are given to the 128 resistors 6 in the order from the reference voltage $VR^-$ side to the reference voltage $VR^+$ side, a potential $VR(m)$ of a node $N(m)$ in one end of the m-th resistor is represented by the following equation:

$$VR(m) = (m/128) \cdot (VR^+ - VR^-) + VR^- \quad (1)$$

Each of the 127 voltages obtained by division by the resistors is applied to a minus terminal of each of 127 comparators 7. An analogue input voltage Vin is applied from an analogue signal input terminal 1 to positive terminals of all of the comparators 7.

It is assumed that the logical value of an output of the comparator 7 to which the potential $VR(m)$ is inputted is $C(m)$. Assuming that the analogue signal Vin which satisfies the following relation is inputted;

$$VR(m) < Vin < VR(m+1) \quad (2)$$

an output $C(k)$ of the k-th comparator is as follows:

$$C(k) = \begin{cases} 0 : k = m+1, \ldots, 127 \\ 1 : k = 0, \ldots, m \end{cases} \quad (3)$$

Outputs of the comparators 7 are latched in D type flip-flops 8 in synchronization with a sampling clock pulse $\phi$ inputted from a clock terminal 2. Assuming that an output of the D type flip-flop 8 to which the output $C(m)$ is inputted is $E(m)$, an AND gate 9 performs the following operation;

$$F(m) = E(m) \cap \overline{E}(m+1) \quad (4)$$

where F(mA) is an output value of the AND gate 9. An output $F(k)$ of the k-th AND gate 9 is as follows:

$$F(k) = \begin{cases} 1 : k = m \\ 0 : k \neq m \end{cases} \quad (5)$$

In summary, only $F(m)$ is "1" and the others are "0" with respect to an input which satisfies the following relation:

$$VR(m) < Vin < VR(m+1) \quad (6)$$

An encoder 10 comprises an ROM or the like, and provides outputs b0 to b7 shown in FIG. 2 with respect to addresses 0 to 127. More specifically, a binary m is outputted with respect to an address m. The output b0 to b7 are latched in D type flip-flops 11 in synchronization with an inverted sampling clock pulse $\bar{\phi}$ outputted from an inverter 12. The D type flip-flops 11 output digital signals D0 to D7.

In the above described manner, the conventional A/D converter of a flash type converts an analogue value to a digital value.

The above described A/D converter of a flash type requires at least the following value as the absolute value of resolution of the comparators 7:

$$(VR^+ - VR^-)/128 \quad (7)$$

For example, assuming that $VR^+ - VR^- = 3$ V, required resolution is approximately 23 mV. Technically it is very difficult to achieve such resolution. It is difficult particularly if an MOS transistor is used, because the threshold value significantly changes in the process. Thus, the resolution of the comparators 7 may not be satisfied due to the problems caused by the design and the process. In such a case, even if a signal as represented by the above described equation (2) is inputted, $C(k)$ (k=0, 1, ..., 127) does not necessarily satisfy the relation as represented by the above described equation (3).

For example, it is assumed that a signal which satisfies the following relation is inputted:

$$VR(62) < Vin < VR(63) \quad (8)$$

It is assumed that the resolution of the comparators 7 does not satisfy the above described equation (7), a comparator which outputs, for example, C(61) and C(62) tends to output "0" and a comparator which outputs, for example, C(63) and C(64) tends to output "1". Such a state may occur near a folded point of patterning, for example, when the comparators 7 are formed on a semiconductor substrate. Therefore, it is assumed that the comparators 7 provide outputs which satisfy the following relations, as shown in FIG. 3:

$$\begin{aligned} C(0), \ldots, C(60) &= 1 \\ C(61), C(62) &= 0 \\ C(63), C(64) &= 1 \\ C(65), \ldots, C(127) &= 0 \end{aligned} \quad (9)$$

In this case, if the comparators 7 essentially have required resolution, the following relations should be satisfied:

$$\begin{aligned} C(0), \ldots, C(62) &= 1 \\ C(63), \ldots, C(127) &= 0 \end{aligned} \quad (10)$$

However, since the resolution is bad, C(61), ..., C(64) are erroneous outputs.

By the outputs of the comparators 7, outputs of the AND gates 9, that is, inputs to the encoder 10 are as follows:

$$F(k) = \begin{cases} 1 : k = 60, 64 \\ 0 : \text{else} \end{cases} \quad (11)$$

The encoder 10 generally comprises a ROM. When a plurality of addresses are selected as represented by the above described equation (11), the OR or the AND for every bit of outputs corresponding to the addresses is outputted. FIG. 4 is a circuit diagram showing a part of an encoder from which the OR is outputted. In the above described example, addresses "60" and "64" of the encoder 10 are selected, "60", i.e., "00111100" and "64", i.e., "01000000" are ORed for every bit, so that an output of the encoder 10 becomes "01111100", i.e., "124".

As described in the foregoing, if resolution of the comparators 7 is insufficient, "124" may be erroneously outputted even if there exists an analogue input which should correctly output a code "63".

The cause of the above described error is that a plurality of addresses instead of one only in the encoder 10 are selected. In the above described example, the difference between a digital output and the correct value thereof is 61, so that a fatal error is caused.

SUMMARY OF THE INVENTION

An object of the present invention is to solve the above described problems of the conventional A/D converter and to provide an A/D converter capable of preventing an output error to a minimum and avoiding a fatal error.

The A/D converter according to the present invention compares individually the value of each of output voltages divided by resistance type potential divider means with the level value of an analogue signal by a plurality of comparator means, and applies outputs of the comparator means to data transfer means. The data transfer means stores and holds the outputs of the plurality of comparator means corresponding to bits and shifts discontinuous portions of logic which appear in stored data of the plurality of bits. An address signal is generated in response to an output of each of the bits of the data transfer means. Encoder means outputs a predetermined digital value corresponding to the address signal.

According to the present invention, since the data transfer means stores and holds the outputs of the plurality of comparator means corresponding to bits as well as shifts the discontinuous portions of logic which appear in stored data of the plurality of bits, the discontinuous portions of logic are shifted so that the data is converted into data in which the same logic is continued. Thus, simultaneous selection of a plurality of addresses in the encoder is avoided.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a diagram showing the relation between inputs and outputs of an encoder 10 shown in FIG. 1 or 5;

FIG. 3 is a diagram for explaining an operation of a conventional A/D converter of a flash type in which a comparator having bad resolution is provided;

FIGS. 7 to 9 are diagrams showing the respective digital output values of three systems which are considered to prevent a plurality of addresses in an encoder from being simultaneously selected, where FIG. 9 illustrates a digital output value of a system used in the present invention; and FIG. 10 is a diagram for explaining an operation of the A/D converter according to the embodiment of the present invention shown in FIG. 5.

DESCRIPTION OF THE PREFERRED EMBODIMENT

Figure 1:
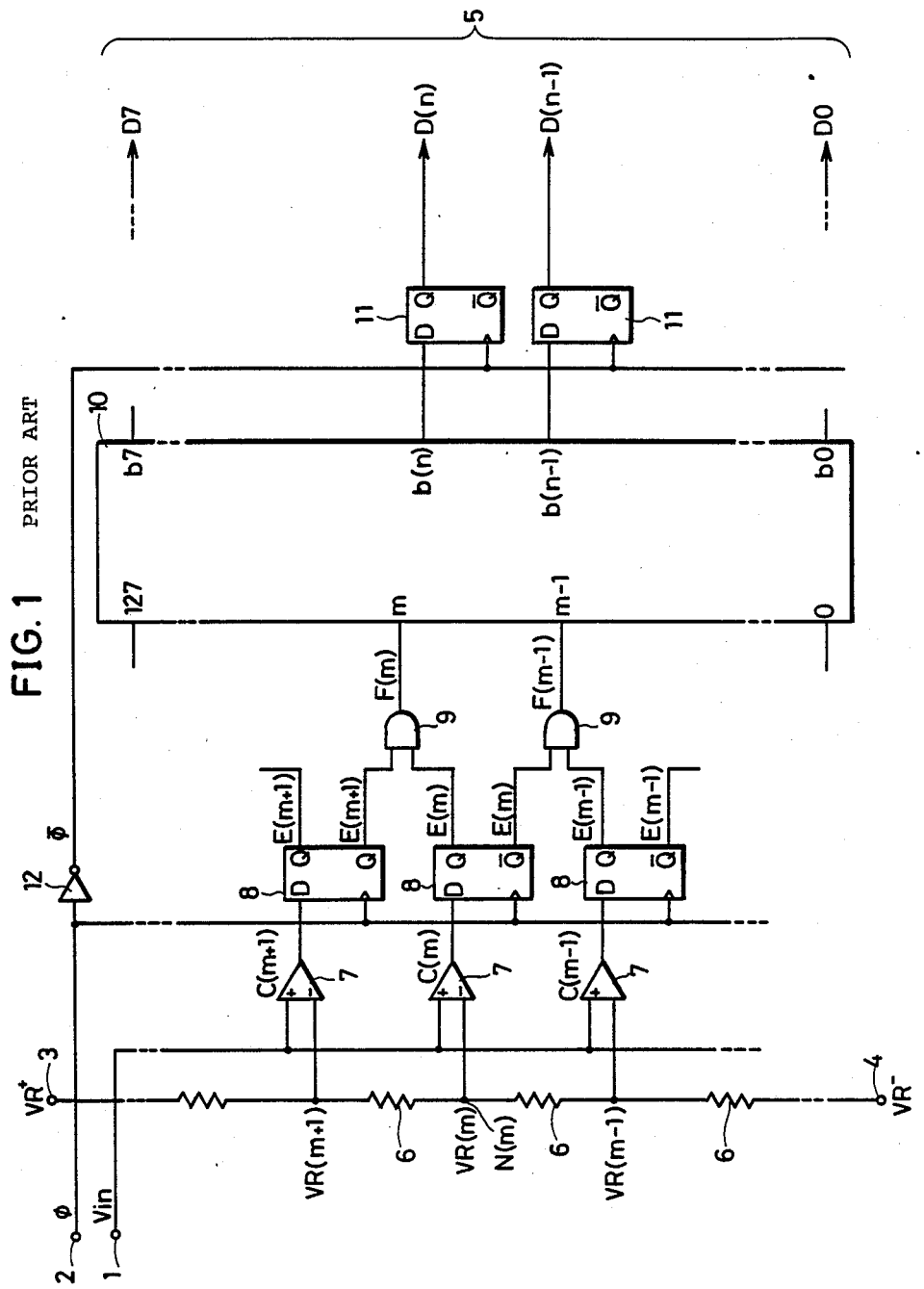
FIG. 1 is a block diagram showing an example of a conventional A/D converter of a flash type.
Figure 4:
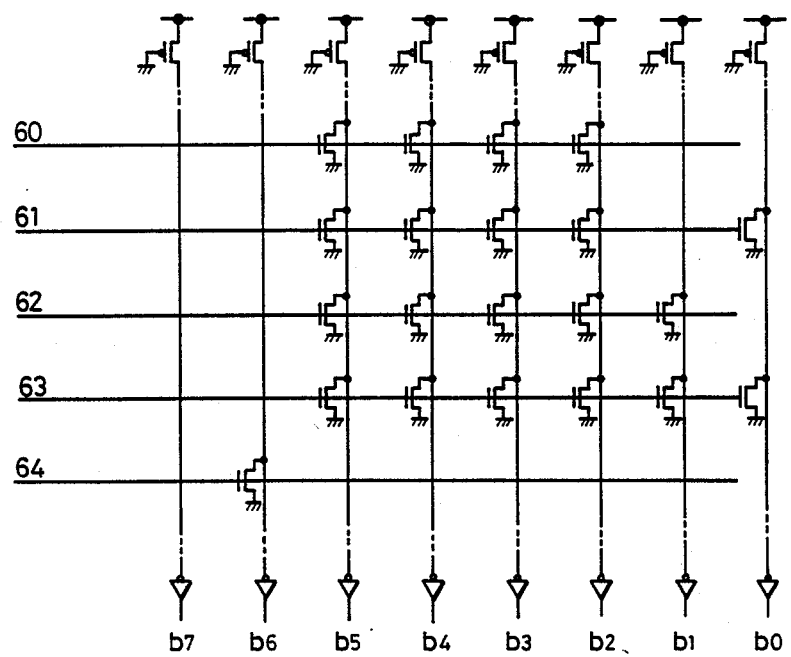
FIG. 4 is a diagram showing an example of circuit structure of the encoder 10 shown in FIG. 1 or 5.

Before explaining a specific embodiment, some methods for preventing a plurality of addresses in an encoder from being simultaneously selected when resolution of comparators is insufficiently are considered. In accordance with the conventional example shown in FIGS. 1 and 3, description is made on the methods.

The following three methods are considered:

(1) A first method is for changing "1" which appears discontinuously, such as C(63) and C(64) to "0".

According to this method, only an output F(60) of outputs of AND gates 9 is "1" and the others are "0". Thus, a plurality of addresses in an encoder 10 are not simultaneously selected. However, if and when comparators 7 which output C(61) and C(62) tend to output "0" and comparators 7 which output C(63) and C(64) tend to output "1" as described above, the value "60" of an actual output is continued several times and then, the actual output is skipped from "60" to "64" or "65". In general, since an analogue signal changes continuously, the linearity between adjacent codes is decreased.

(2) A second method is for changing "0" which appears discontinuously such as, for example, C(61) and C(62) to "1".

According to this method, for the same reason as that of the first method (1), the actual output is, in the worst case, skipped from "60" to "64" and then, "64" is continued several times, as shown in FIG. 8. Thus, similarly to the first method (1), the linearity between adjacent codes is decreased.

(3) A third method is for shifting "1" which appears discontinuously such as C(63) and C(64) in the direction of C(60).

According to this method, the actual output changes relatively continuously, as shown in FIG. 9. More specifically, the linearity between adjacent codes is held.

For the above described reasons, the present invention is to avoid selecting simultaneously a plurality of addresses in an encoder using the above described third method (3). Description is now made on a specific embodiment.

Figure 5:
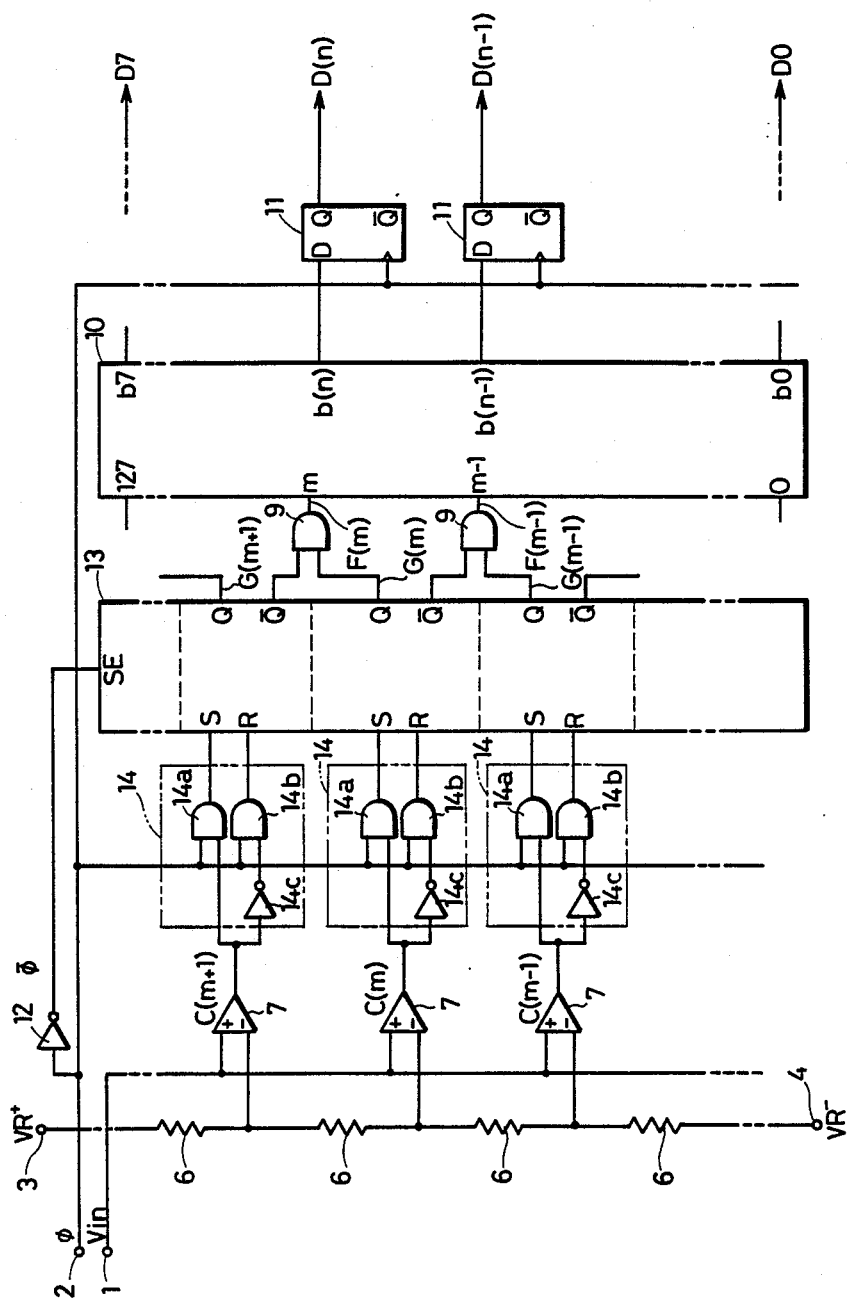
FIG. 5 is a block diagram showing an A/D converter of a flash type according to an embodiment of the present invention.

FIG. 5 is a circuit diagram showing an A/D converter of a flash type according to an embodiment of the present invention. The A/D converter according to the present embodiment is the same as the conventional A/D converter shown in FIG. 1 except for the following. The corresponding portions have the same reference numerals and hence, the description thereof is omitted. The most significant characteristic of the present embodiment is that the D type flip-flop 8 shown in FIG. 1 is replaced with a data transfer circuit 13 of a hand shake type. In the data transfer circuit 13, a portion enclosed by a broken line corresponds to one bit. The data transfer circuit 13 has the same number of bits as that of comparators 7. Each of the bits of the data transfer circuit 13 has a set terminal receiving a set signal S and a reset terminal receiving a reset signal R, and provides a Q output and a $\overline{Q}$ output. In addition, a common shift enable signal SE is applied to the bits. The shift enable signal SE is an inverted sampling clock pulse $\overline{\phi}$ outputted from an inverter 12. The set signal S and the reset signal R applied to each of the bits are generated in each of set/reset signal generating circuits 14. Each of the set/reset signal generating circuits 14 is provided corresponding to each of the comparators 7, and comprises two AND gates 14a and 14b and an inverter 14c. Each of the AND gates 14a and 14b has one input receiving a sampling clock pulse $\phi$. The AND gate 14a has another input receiving an output of a corresponding comparator 7. The AND gate 14b has another input receiving an output obtained by inverting the output of the corresponding comparator 7 by the inverter 14c. In such structure, when the sampling clock pulse $\phi$ is "1", the AND gates 14a and 14b are opened, so that the set signals or the reset signal R is applied to each of the bits of the data transfer circuit 13. More specifically, when the output of the comparator 7 is "1", the set signal S(=1) is applied to a corresponding bit of the data transfer circuit 13. On the other hand, when the output of the comparator 7 is "0", the reset signal R(=1) is applied to a corresponding bit of the data transfer circuit 13. Each of AND gates 9 is arranged such that the Q output and the $\overline{Q}$ output of adjacent bits of the data transfer circuit 13 are ANDed.

In the above described structure, the data transfer circuit 13 latches data in response to the set signal S and the reset signal R when the shift enable signal SE is "0", and shifts "1" which appears discontinuously, of the latched data in the transferring direction (direction from top to bottom in FIG. 5) when the shift enable signal SE is "1". More specifically, the data transfer circuit 13 performs the above described third operation, so that the discontinuity of data is solved.

Figure 6:
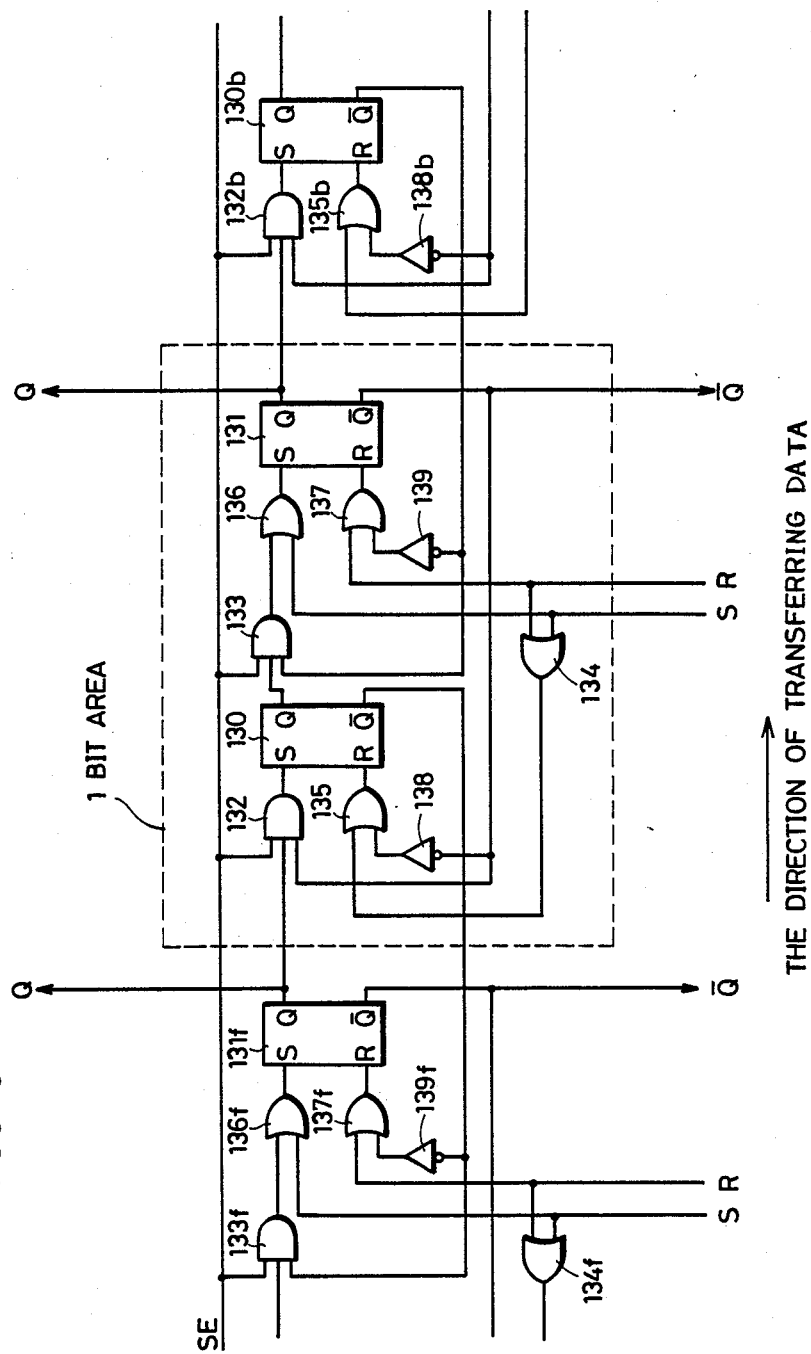
FIG. 6 is a circuit diagram showing an example of structure of a portion of a data transfer circuit 13 shown in FIG. 5.

FIG. 6 is a circuit diagram showing an example of structure of the data transfer circuit 13 shown in FIG. 5. FIG. 6 illustrates structure of one bit and structure of a portion of bits before and behind the bit. In FIG. 6, the direction of transferring data is a direction from left to right. One bit of the data transfer circuit 13 comprises two RS flip-flops 130 and 131, two AND gates 132 and 133, three OR gates 135 to 137 and two inverters 138 and 139. The bits have the same structure and hence, the corresponding portions in the bits have the same reference numerals. Briefly stated for illustration, an initial letter f for "forward" is attached at the end of the reference numeral of each of elements in the previous stage, and an initial letter b for "back" is attached at the end of the reference numeral of each of elements in the subsequent stage.

Referring now to FIG. 6, description is made on operation of the data transfer circuit 13.

(1) A case in which a shift enable signal SE is "0".

In this case, both the AND gates 132 and 133 are closed, so that outputs thereof are "0". Thus, the RS flip-flop 130 is reset because the set signal or the reset signal is "1". On the other hand, if the set signal is "1", "1" is inputted to a set input terminal of the RS flip-flop 131 through the OR gate 136, so that the RS flip-flop 131 is set. Contrary to this, if the reset signal S is "1", the RS flip-flop 131 is reset.

In summary, if S=1 and R=0, the RS flip-flop 131 is set and the RS flip-flop 130 is reset. In addition, if S=0 and R=1, both the RS flip-flops 130 and 131 are reset. More specifically, if the SE=0, the RS flip-flop 130 is forced to be reset and an output of each of the comparators 7 is latched in the corresponding RS flip-flop 131.

(2) A case in which the shift enable signal SE is "1".

In this case, it is assumed that the output of each of the comparators 7 has been already latched in the RS flip-flop 131 in each of the bits in the period of SE=0, as described above. In such a state, when the shift enable signal SE(=$\overline{\phi}$) becomes "1", the sampling clock pulse $\phi$ becomes "0". As a result, both the above described AND gates 14a and 14b are closed, so that the set signal S and the reset signal R become "0".

1. A case in which the RS flip-flop 131 stores "0" (that is, the RS flip-flop 131 is reset).

In this case, a Q output of the RS flip-flop 131 is "0" and a $\overline{Q}$ output thereof is "1". Thus, if an RS flip-flop 131f in the previous stage is set, the AND gate 132 allows the passage of the Q output(=1) to set the RS flip-flop 130. Contrary to this, if the RS flip-flop 131f is reset, no change is made, so that the RS flip-flops 130 and 131 remain in the previously stored state.

If the RS flip-flop 130 is set, a $\overline{Q}$ output thereof is "0". The $\overline{Q}$ output is inverted to "1" by an inverter 139f and then, returned to a reset input terminal of the RS flip-flop 131f through an OR gate 137f. Thus, the RS flip-flop 131f is reset.

On the other hand, since an RS flip-flop 130b in the subsequent stage is reset when the shift enable signal SE is "0", a $\overline{Q}$ output thereof is "1". The $\overline{Q}$ output is applied to the AND gate 133. Thus, a Q output of the RS flip-flop 130 is applied to a set input terminal of the RS flip-flop 131 through the AND gate 133 and the OR gate 136. Therefore, the content stored in the RS flip-flop 130 is written to the RS flip-flop 131.

As described in the foregoing, if the RS flip-flop 131 stores "0" (that is, it is reset) and the RS flip-flop 131f stores "1" (that is, it is set), the content (=1) stored in the RS flip-flop 131f in the previous stage is shifted to the RS flip-flop 131, so that the RS flip-flop 131f is reset. The shift operation is repeatedly performed while the shift enable signal SE is "1".

2. A case in which the RS flip-flop 131 stores "1" (that is, it is set).

In this case, the Q output of the RS flip-flop 131 is "1" and the $\overline{Q}$ output thereof is "0". Thus, the AND gate 132 is closed irrespective of the Q output of the RS flip-flop 131f in the subsequent stage. Thus, the RS flip-flop 130 remains in the previously stored state.

As described in the foregoing, in the case in which the shift enable signal SE is "1", if "1" is held in a certain bit and "0" is held in a bit in the subsequent stage, the "1" being held is successively shifted to bits in the subsequent stages and stopped immediately before a bit in which "1" is held in advance. More specifically, "1" which appeared discontinuously is shifted.

Returning to FIG. 5, it is assumed that there exist an analogue input as represented by the above described equation (8). In addition, it is assumed that each of the comparators 7 has bad resolution and provides outputs as represented by C(k) in FIG. 10. The output C(k) is set to each of the bits of a data transfer circuit 13. Thereafter, the shift enable signal SE is forced to be "1", so that the "1" which appears discontinuously is shifted. Consequently, a Q output of each of the bits of the data transfer circuit 13 becomes as represented by G(k) in FIG. 10. Therefore, outputs F(k) of the AND gates 9 are as follows:

$$F(k) = \begin{cases} 1 : k = 62 \\ 0 : \text{else} \end{cases}$$

Thus, a plurality of addresses in the encoder 10 are not selected. The conventional circuit shown in FIG. 5 in which the data transfer circuit 13 is not provided should correctly output "63". However, the conventional circuit outputted "124". The circuit according to an embodiment shown in FIG. 5 having the data transfer circuit 13 added thereto outputs "62" and never provides a fatally erroneous output error as in the conventional circuit. In addition, the linearity between adjacent codes is held.

Each logic gate used in FIGS. 5 and 6 may be replaced with the other circuits or a combination of the other logic gates in which the same function is achieved.

Additionally, although in the above described embodiment, description is made using positive logic, a circuit may be formed using negative logic.

As described in the foregoing, according to the present invention, an A/D converter capable of preventing a plurality of addresses in an encoder from being simultaneously selected without decreasing the linearity between adjacent codes can be obtained with a high accuracy.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An A/D converter for converting an analogue signal into a digital signal in synchronization with a sampling clock ($\phi$), comprising
resistance type potential divider means comprising a plurality of resistor elements connected in series between a first reference voltage terminal receiving a first reference voltage and a second reference voltage terminal receiving a second reference voltage which has a different value from that of said first reference voltage,
a plurality of comparator means for comparing individually a plurality of voltages outputted from one end of each of resistors of said resistance type potential divider means with the level value of said analogue signal,
data transfer means for storing and holding output bits of said plurality of comparator means in the form of logic data bits, said data transfer means shifting discontinuous portions of said logic data bits
means responsive to the output bits of said data transfer means for generating an address signal, and
encoder means for outputting a predetermined digital value corresponding to said address signal.

2. An A/D converter according to claim 1, wherein said data transfer means comprises a plurality of stages, one for each of the bits, each stage comprising
storing means for storing and holding outputs of said comparators, and
shifting means for shifting the content stored in a previous stage if a second logic level is stored therein when a first logic is stored in said storing means.

3. An A/D converter according to claim 2, wherein said shifting means is enabled by a shift enable clock pulse which is synchronized with a sampling clock pulse.

4. An A/D converter for converting an analogue signal into a digital signal in synchronization with a sampling clock, comprising
resistance type potential divider means comprising a plurality of resistor elements connected in series between a first reference voltage terminal receiving a first reference voltage and a second reference voltage terminal receiving a second reference voltage which has a different value from that of said first reference voltage,
a plurality of comparator means for comparing individually a plurality of voltages outputted from one end of each of resistors of said resistance type potential divider means with the level value of said analogue signal,
data transfer means for storing and holding output bits of said plurality of comparator means in the form of logic data bits, said data transfer means shifting discontinuous portions of said logic data bits said data transfer means including signal generating circuit means for selectively setting and resetting output bits of said data transfer means,
means responsive to the output bits of said data transfer means for generating an address signal, and
encoder means for outputting a predetermined digital value corresponding to said address signal.

* * * * *